(12) United States Patent
Wuister (10) Patent No.: US 9,726,973 B2
(45) Date of Patent: Aug. 8, 2017

(54) IMPRINT LITHOGRAPHY APPARATUS AND METHOD

(75) Inventor: Sander Frederik Wuister, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 741 days.

(21) Appl. No.: 13/510,596

(22) PCT Filed: Oct. 1, 2010

(86) PCT No.: PCT/EP2010/064662
§ 371 (c)(1),
(2), (4) Date: May 17, 2012

(87) PCT Pub. No.: WO2011/064021
PCT Pub. Date: Mar. 6, 2011

(65) Prior Publication Data
US 2012/0223460 A1    Sep. 6, 2012

Related U.S. Application Data

(60) Provisional application No. 61/265,077, filed on Nov. 30, 2009.

(51) Int. Cl.
*B29C 41/42*    (2006.01)
*G03F 7/00*     (2006.01)
*B82Y 10/00*    (2011.01)
*B82Y 40/00*    (2011.01)

(52) U.S. Cl.
CPC ............ *G03F 7/0002* (2013.01); *B82Y 10/00* (2013.01); *B82Y 40/00* (2013.01)

(58) Field of Classification Search
CPC .................................................. G03F 7/0002
USPC ........................................ 425/174.4; 264/496
See application file for complete search history.

(56) References Cited

U.S. PATENT DOCUMENTS

| 4,731,155 A | 3/1988 | Napoli et al. |
| 5,772,905 A | 6/1998 | Chou |
| 6,334,960 B1 | 1/2002 | Willson et al. |
| 6,517,995 B1 * | 2/2003 | Jacobson et al. ............ 264/1.1 |

(Continued)

FOREIGN PATENT DOCUMENTS

| WO | 02/067055 | 8/2002 |
| WO | 2010/047755 | 4/2010 |

OTHER PUBLICATIONS

International Search Report mailed Feb. 28, 2011 in corresponding International Patent Application No. PCT/EP2010/064662.

(Continued)

*Primary Examiner* — Timothy Kennedy
(74) *Attorney, Agent, or Firm* — Pillsbury Winthrop Shaw Pittman LLP (57) ABSTRACT

A lithographic apparatus is disclosed that includes an imprint template holder configured to hold an imprint template, and a dispensing mechanism of polar molecules, wherein the dispensing mechanism of polar molecules is configured to provide polar molecules into a local environment in the vicinity of the imprint template, such that the concentration of polar molecules in the local environment in the vicinity of the imprint template is greater than the concentration of polar molecules in other parts of the lithographic apparatus.

22 Claims, 4 Drawing Sheets

(56) References Cited

U.S. PATENT DOCUMENTS

| | | |
|---|---|---|
| 6,819,427 B1 * | 11/2004 | Subramanian et al. ...... 356/445 |
| 2004/0124566 A1 | 7/2004 | Sreenivasan et al. |
| 2005/0274693 A1 | 12/2005 | Heidari et al. |
| 2006/0012079 A1 | 1/2006 | Jung et al. |
| 2007/0063384 A1 | 3/2007 | Choi et al. |
| 2007/0077325 A1 | 4/2007 | Yu |
| 2008/0131623 A1 | 6/2008 | Zhang et al. |
| 2009/0169663 A1 | 7/2009 | Houle et al. |

OTHER PUBLICATIONS

Jan Haisma et al. "Mold-assisted nanolithography: A process for reliable pattern replication," J. Vac. Sci. Technol., vol. B 14, No. 6, pp. 4124-4128 (Nov./Dec. 1996).

Kar Tean Tan et al., "On the Origins of Sudden Adhesion Loss at a Critical Relative Humidity: Examination of Bulk and Interfacial Contributions," Langmuir, vol. 24, No. 17, pp. 9189-9193 (2008).

* cited by examiner

IMPRINT LITHOGRAPHY APPARATUS AND METHOD

This application is the United States national phase entry of PCT patent application no. PCT/EP2010/064622, filed Oct. 1, 2010, which claims the benefit of U.S. provisional patent application No. 61/265,077, which was filed on Nov. 30, 2009, the contents of both of which are incorporated herein in their entireties by reference.

FIELD

The present invention relates to an imprint lithography apparatus and method.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g., nanometer sized feature or sub micron sized features) that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable liquid medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface. The recesses define pattern features of the patterned surface of the imprint lithography template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

SUMMARY

Once the imprintable medium has been brought into the solidified (e.g. cured) state, there is significant adhesion between the imprintable medium and the imprint template. It is desirable to separate the imprint template from the imprintable medium without damaging the pattern formed in the imprintable medium. In order to assist in the separation of the imprint template from the imprintable medium, a release layer may be provided on the imprint template. The release layer may be, for example, an organic release layer. However, an organic release layer may suffer from a disadvantage that it is prone to chemical and/or mechanical wear, and may therefore need to be replaced after a couple of hundred thousand imprints have been performed using the imprint template. An inorganic release layer may be used instead of an organic release layer. An inorganic release layer is less prone to wear, and provides higher durability.

It is desirable, for example, to reduce the force which is required to separate an imprint template having an inorganic release layer from solidified (e.g. cured) imprintable medium.

According to an aspect, there is provided A lithographic apparatus comprising an imprint template holder configured to hold an imprint template, and a dispensing mechanism of polar molecules, wherein the dispensing mechanism of polar molecules is configured to provide polar molecules into a local environment in the vicinity of the imprint template, such that the concentration of polar molecules in the local environment in the vicinity of the imprint template is greater than the concentration of polar molecules in other parts of the lithographic apparatus.

According to an aspect, there is provided A method of imprint lithography using a lithographic apparatus, comprising: providing polar molecules into a local environment in the vicinity of an imprint template having an inorganic release layer, such that the concentration of polar molecules in the local environment in the vicinity of the imprint template is greater than the concentration of polar molecules in other parts of the lithographic apparatus, thereby causing polar molecules to adhere to the release layer; bringing the imprint template into contact with imprintable medium on a substrate; solidifying the imprintable medium; and then separating the imprint template from the solidified imprintable medium.

BRIEF DESCRIPTION OF THE DRAWINGS

Specific embodiments of the invention will be described with reference to the accompanying figures, in which.

DETAILED DESCRIPTION

Figure 1A:
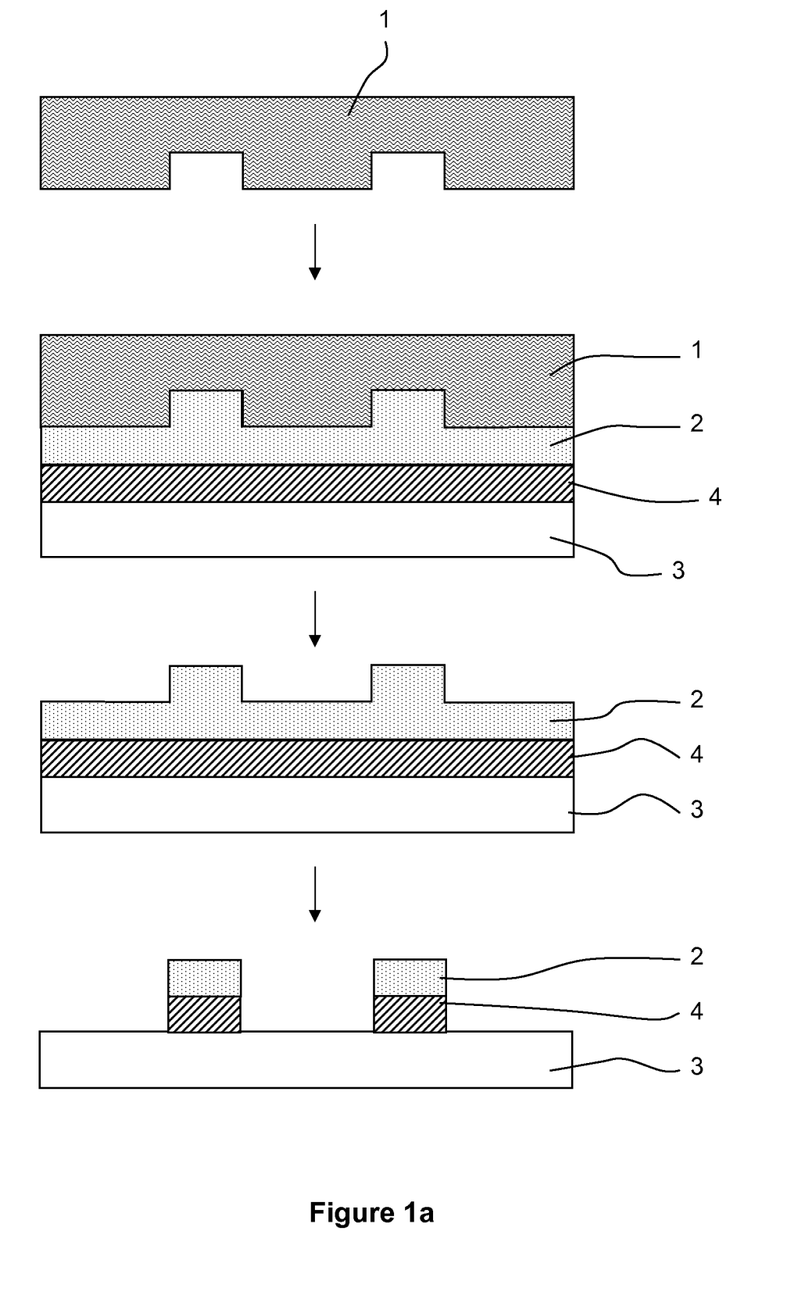
FIGS. 1a and 1b schematically depict examples of, respectively, hot imprint, and UV imprint lithography.
Figure 1B:
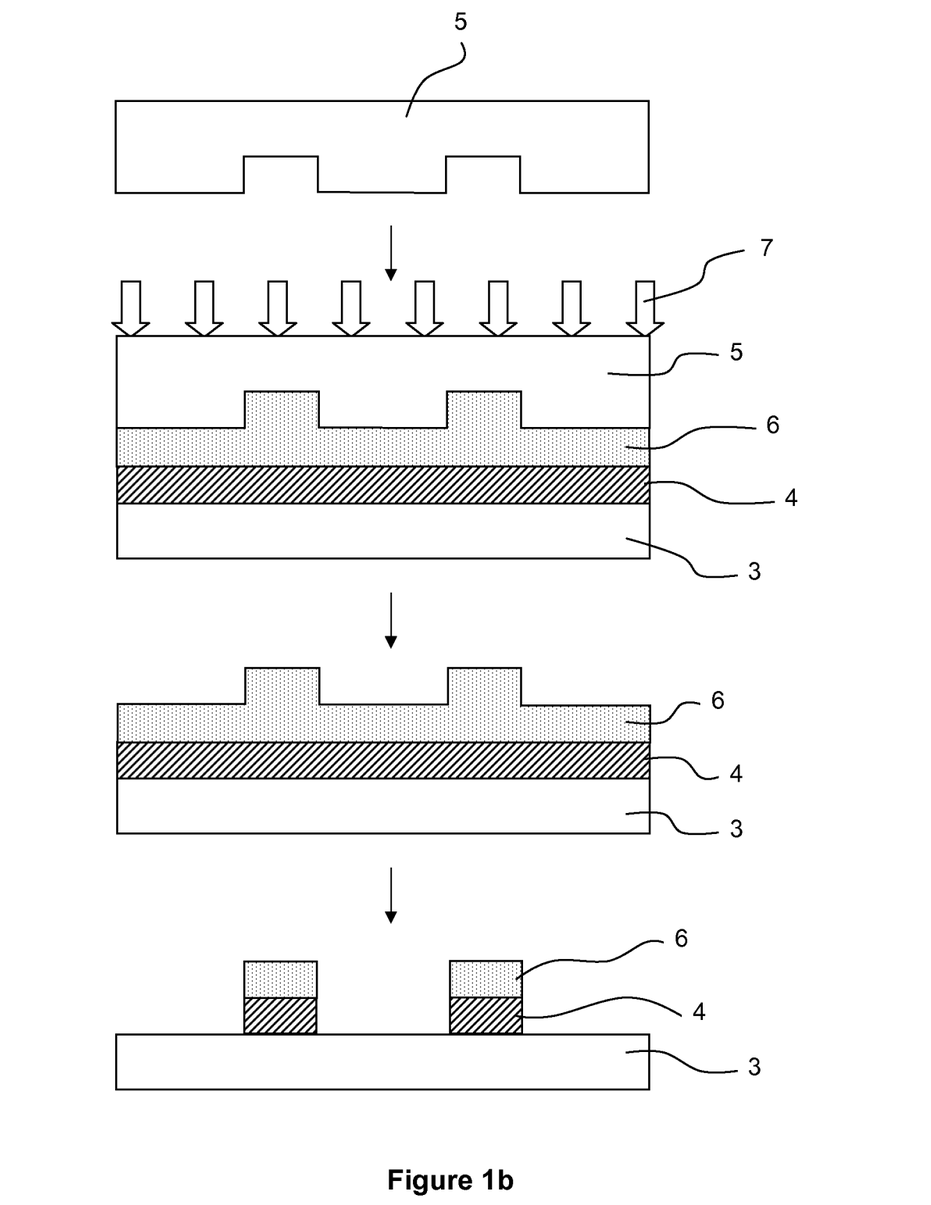

Examples of approaches to imprint lithography are schematically depicted in FIGS. 1a to 1b.

FIG. 1 a shows an example of so-called hot imprint lithography (or hot embossing). In a typical hot imprint process, a template 1 is imprinted into a thermosetting or a thermoplastic imprintable medium 2, which has been cast on the surface of a substrate 3. The imprintable medium 2 may be, for example, resin. The resin may, for instance, be spin coated and baked onto the substrate surface or, as in the example illustrated, onto a planarization and transfer layer 4 of the substrate 3. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 1 may then be removed and the patterned resin cooled. In hot imprint lithography employing a layer of thermoplastic polymer resin, the thermoplastic resin is heated so that it is in a freely flowable state immediately prior to imprinting with the template 1. It may be necessary to heat a thermoplastic resin to a temperature considerably above the glass transition temperature of the resin. The template is pressed into the flowable resin and then cooled to below its glass transition temperature with the template 1 in place to harden the pattern. Thereafter, the template 1 is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). UV curable liquids are often less viscous than the thermosetting and thermoplastic resins used in hot imprint lithography and consequently may move much faster to fill template pattern features. A quartz imprint template 5 is applied to a UV-curable resin 6 in a similar manner to the process of FIG. 1a. However, instead of using heat or temperature cycling as in hot imprint, the pattern is solidified by curing the imprintable medium 6 with UV radiation 7 that is applied through the quartz imprint template 5 onto the imprintable medium 6. After removal of the template 5, the imprintable medium 6 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., U.S. Patent Application Publication No. 2005-0274693, which mentions a combination of heating and UV curing an imprintable medium.

Figure 2:
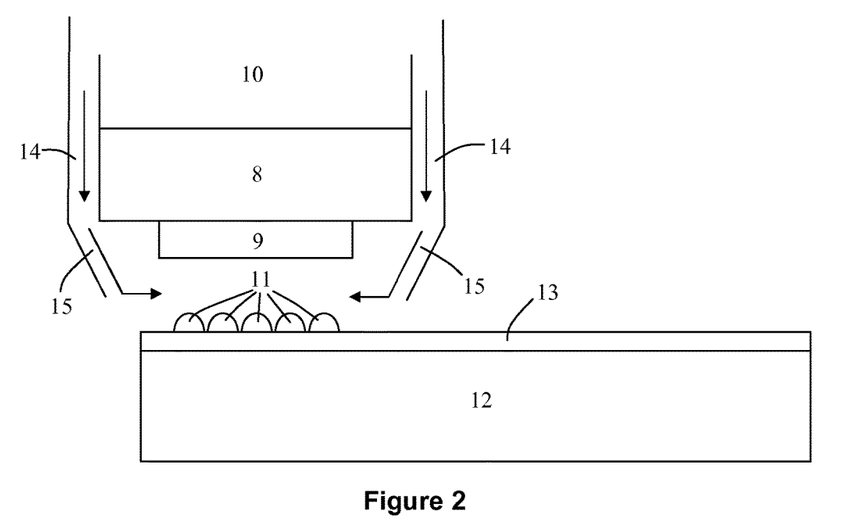
FIG. 2 schematically depicts an imprint lithography apparatus according to an embodiment of the invention.

FIG. 2 shows schematically an imprint lithography apparatus in which a local environment in the vicinity of an imprint template has a higher humidity than other parts of the lithographic apparatus. The imprint lithography apparatus comprises an imprint template holder 8 which is configured to hold an imprint template 9. The imprint template 9 is provided with an inorganic release layer (not shown). The inorganic release layer may be, for example, a metal oxide or metal nitride layer (e.g. $TiO_x$ or $SiN_x$). The imprint template holder 8 is connected to an actuator 10 which is configured to bring the imprint template 9 into contact with imprintable medium 11 provided on a substrate 12. A planarization layer 13 may be provided between the substrate 12 and the imprintable medium 11. One or more channels 14 carry helium gas to opening(s) 15 in the vicinity of the imprint template 9. The helium gas is thus present in the local environment of the imprint template 9.

The lithographic apparatus may further comprise a source of actinic radiation (not shown) which is configured to direct radiation onto the imprintable medium 11, when the imprint template 9 is in contact with the imprintable medium, thereby curing the imprintable medium.

The helium gas assists in the dissolution of inclusions which may be present between droplets of the imprintable medium during imprint. Such inclusions may arise when droplets of imprintable medium coalesce beneath the imprint template 9 during imprint. The helium gas dissolves into the imprintable medium during imprint due to the capillary pressure induced by the imprintable medium, and the inclusions thus disappear.

The helium gas increases the humidity of the local environment in the vicinity of the imprint template 9. It does this by carrying water vapor and delivering the water vapor to the local environment in the vicinity of the imprint template 9. As a consequence of the humidity of the local environment in the vicinity of the imprint template 9, water condenses on the imprint template (including on a patterned surface of the imprint template). The water may form a film on the imprint template. The water remains in place on the imprint template 9 when the imprint template is brought into contact with the imprintable medium 11, and remains in place when the imprintable medium is cured.

The water reduces adhesion at the interface between the imprint template 9 and the cured imprintable medium. In the absence of the water, the interface between the imprint template and the imprintable medium would be a solid-solid interface. When the water is present, the interface is a solid-liquid-solid interface. This may be thought of as two solid-liquid interfaces. Solid-liquid interfaces have lower adhesion energy (interfacial energy) than solid-solid interfaces. Consequently, the force which is required to separate the imprint template from the cured imprintable medium is lower than would be the case if the water was not present.

It is not necessarily the case that the film of water covers all of the patterned surface of the imprint template. There may be gaps or breaks in the film of water, for example such that there is effectively a plurality of separate films of water. The presence of some water on the imprint template 9, even if the water does not form a film which covers all of the patterned surface of the imprint template, provides a significant reduction of the interfacial energy between the imprint template and the cured imprintable medium.

The humidity in the local environment in the vicinity of the imprint template 9 may be, for example, 65% relative humidity (RH) or higher. The interfacial energy between two surfaces may drop significantly at around 65% RH. For example, the interfacial energy of a ceramic/polymer interface drops significantly when the RH is 65% or higher, as is shown in "On the Origins of Sudden Adhesion Loss at a Critical Relative Humidity: Examination of Bulk and Interfacial Contributions"; K T Tan et al., Langmuir 2008, 24, 9189-9193.

The humidity inside a typical imprint lithography apparatus may be, for example, between 30% and 50% RH. Thus, the humidity of the local environment in the vicinity of the imprint template 9 is raised to a higher humidity than is seen in other parts of the imprint lithography apparatus. This raised humidity provides a reduction of the interfacial energy between the imprint template and the imprintable medium. In an embodiment, the humidity of the local environment in the vicinity of the imprint template may be above 65% RH, and may be above 70% RH.

Figure 3A:
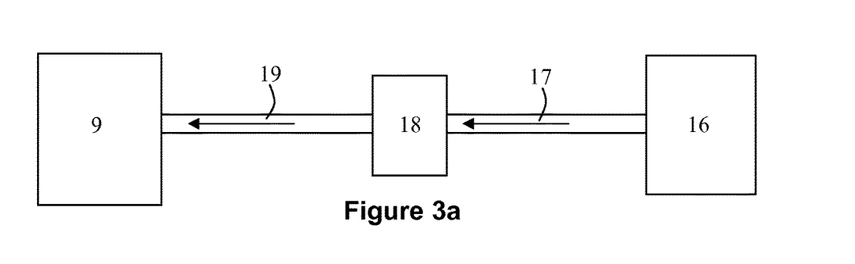
FIG. 3a schematically depicts part of the imprint lithography apparatus of FIG. 2.

FIG. 3a shows schematically an apparatus which may be used to mix water vapor with the helium gas. A helium gas supply 16 provides helium gas which passes through a pipe 17 to a water tank 18. The helium gas passes through the water tank 18, mixing water vapor with the helium gas. The helium gas and water vapor mixture then passes through a pipe 19 to an outlet (not shown) at the imprint template holder 8 or imprint template 9. The helium gas and water vapor mixture provides an increased humidity of the local environment in the vicinity of the imprint template.

Figure 3B:
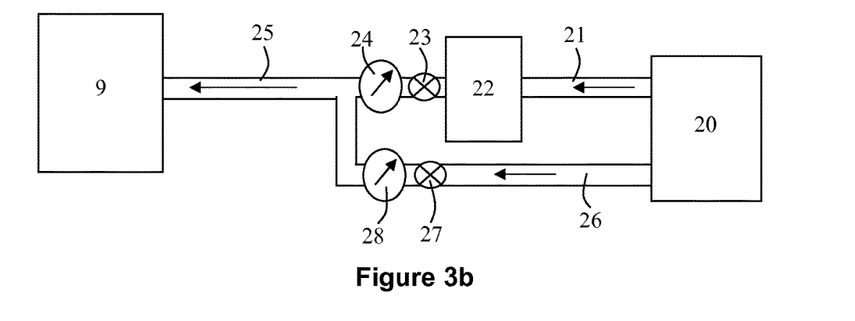
FIG. 3b schematically depicts an alternative part of the imprint lithography apparatus of FIG. 2.

FIG. 3b shows a further apparatus which may be used to mix water vapor with helium gas. A helium gas supply 20 provides helium gas which passes through a first pipe 21 to a water tank 22. The helium gas passes through the water tank 22, mixing water vapor with the helium gas. The helium and water vapor mixture passes through a valve 23 and flow meter 24 and then passes through a second pipe 25 to an outlet (not shown) at the imprint template holder 8 or imprint template 9. A third pipe 26 is connected to the helium gas supply 20 and carries helium gas through an additional valve 27 and flow meter 28. The third pipe 26 then joins with the second pipe 25, which carries the helium gas to the outlet at the imprint template holder or imprint template.

The helium gas which travels through the third pipe 26 is not mixed with water, and so is dry. The helium gas which passes through the water tank 22 is wet (i.e. is mixed with water vapor). The valves 23, 27 may be used to adjust the rate of flow of dry helium and wet helium, and thereby control the humidity of the helium gas which is delivered to the outlet at the imprint template holder or imprint template. The flow meters 24, 28 may be used to allow the rate of flow of the gases to be monitored. A hygrometer (not shown) may be used to monitor the humidity of the gas of the local environment in the vicinity of the imprint template. The output of the hygrometer may be used as an input when determining how to adjust the humidity of the helium gas delivered to the outlet at the imprint template holder or imprint template. Adjustment of the humidity of the helium gas may be performed automatically by a controller (not shown) which controls the valves 23, 27.

In an arrangement (not illustrated) the dry helium and the wet helium are not mixed before they are delivered to the local environment in the vicinity of the imprint template, but instead are delivered separately. The dry helium and the wet helium then mix in the local environment in the vicinity of the imprint template. The humidity of the local environment in the vicinity of the imprint template may be controlled by controlling the rate of flow of the dry helium and wet helium in the manner described above.

Known lithographic apparatus include apparatus which provide gas flow (sometimes referred to as gas or air showers) that is intended to transport contamination particles out of the lithographic apparatus. The known apparatus include one or more ducts and pumps which are used to pump air or other gas out of the lithographic apparatus. The duct(s) may also remove helium gas and water vapor from the lithographic apparatus.

A continuous flow of helium and water vapor may be provided to the local environment in the vicinity of the imprint template. This continuous flow may maintain the humidity of the local environment above 65% RH. Other parts of the lithographic apparatus may have a significantly larger combined volume than the local environment in the vicinity of the imprint template. These other parts of the lithographic apparatus will remain at significantly lower humidity than the local environment in the vicinity of the imprint template. This is because the helium gas and water vapor will mix with dryer gas in the lithographic apparatus (the dryer gas being provided for example by a gas shower). On mixing with the dryer gas the helium and water vapor mixture is effectively diluted, thereby leading to a reduction of humidity. The mixture of helium, water vapor and dryer gas may be pumped from the lithographic apparatus using the one or more ducts and pumps mentioned above.

Water may tend to preferentially condense on the imprint template 9 because the inorganic release layer may have an affinity for water. However, some water may condense on one or more surfaces of the lithographic apparatus other than the imprint template 9. Where this occurs, the flow of gas within the lithographic apparatus may evaporate the water, and may carry the resulting water vapor from the lithographic apparatus.

Although the above description refers to the use of helium gas, any other suitable gas may be used. An inert gas may be advantageous since it will not react with the imprintable medium 11. A small molecule such as helium may be advantageous due to its higher diffusivity in the imprintable medium 11.

Figure 4:
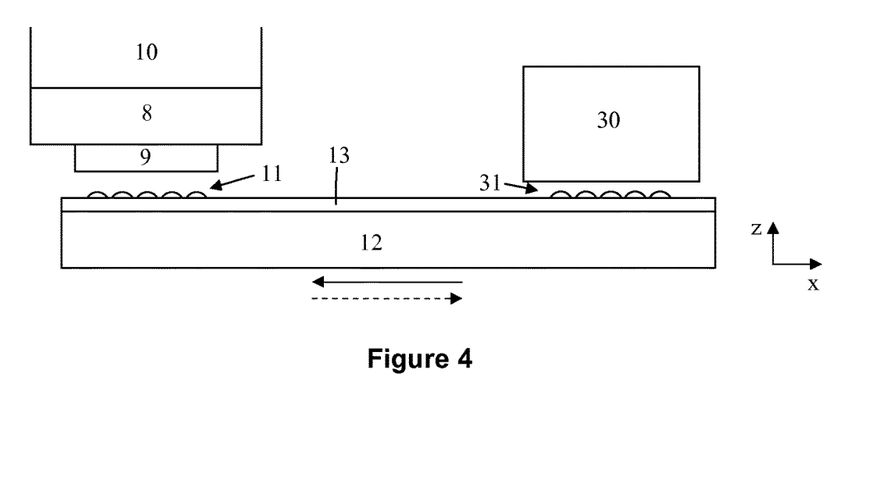
FIG. 4 schematically depicts an imprint lithography apparatus according to an embodiment of the invention.

FIG. 4 shows a further embodiment of the invention. Some features of the embodiment shown in FIG. 4 correspond with those shown in FIG. 2, and are given the same reference numerals. An imprint template holder 8 holds an imprint template 9 which is provided with an inorganic release layer (not shown). Imprintable medium 11 is provided on a planarization layer 13 of a substrate 12 (in some instances the planarization layer 13 may be omitted). An actuator 10 is used to bring the imprint template 9 into contact with the imprintable medium 11, and thereby imprint a pattern into the imprintable medium. A source of actinic radiation (not shown) is then used to cure the imprintable medium.

A print head 30 is also located over the substrate 12. The print head 30 is configured to deliver droplets of water 31 onto the substrate 12. The print head 30 may be, for example, a print head which would conventionally be used to provide droplets of imprintable medium onto the substrate, but has been connected to a supply of water so that it provides droplets of water instead. The print head may have a single nozzle or multiple nozzles which are used to provide the droplets of water. Multiple nozzles may be preferred, since they allow the droplets to be provided more quickly.

Once the droplets of water 31 have been provided on the substrate 12, the substrate is moved (in the direction shown by the solid arrow) until the droplets of water 31 are located beneath the imprint template 9. The droplets of water 31 evaporate, thereby increasing the humidity in the local environment of the imprint template 9. Water condenses on the imprint template 9, thereby providing a film of water on the surface of the imprint template. The film of water may include gaps or discontinuities, and may effectively be a plurality of films of water. The substrate 12 is again moved (in the direction shown by the dashed arrow) until the imprintable medium 11 is located beneath the imprint template 9. The actuator 10 is then used to bring the imprint template 9 into contact with the imprintable medium 11, thereby imprinting a pattern into the imprintable medium. Actinic radiation is then used to cure the imprintable medium, following which the imprint template 9 is separated from the cured imprintable medium 11. The water which is present on the imprint template 9 reduces the force which is required to remove the imprint template 9 from the cured imprintable medium 11 (compared with the force which would be required if the water was not present).

The speed at which the droplets of water 31 evaporate may be controlled to some extent by selecting a diameter for the droplets of water when they are provided by the print head 30. Droplets of water having larger diameters will evaporate more slowly than droplets of water having smaller diameters.

In an arrangement, instead of or in addition to moving the substrate 12 in order to position the water droplets 31 beneath the imprint template 9, the imprint template may be moved such that it is over the water droplets. The print head 30 may be moved to one side (or moved upwards) in order to provide space above the water droplets 31 into which the imprint template 9 may move.

Figure 5:
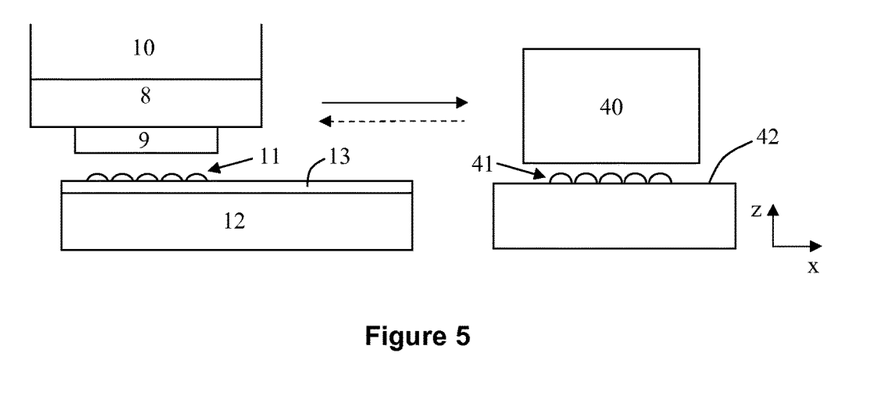
FIG. 5 schematically depicts an imprint lithography apparatus according to a further embodiment of the invention.

A further embodiment of the invention is shown in FIG. 5. Features which correspond with those shown in FIGS. 2 and 4 are given the same reference numerals in FIG. 5. An imprint template holder 8 holds an imprint template 9 which is provided with an inorganic release layer (not shown). Imprintable medium 11 is provided on a planarization layer 13 of a substrate 12 (in some instances the planarization layer may be omitted). An actuator 10 is used to bring the imprint template 9 into contact with the imprintable medium 11, and thereby imprint a pattern into the imprintable medium. A source of actinic radiation (not shown) is then used to cure the imprintable medium.

A print head 40 is used to provide droplets of water 41 on a surface 42 which is provided within the lithographic apparatus. The print head 40 is configured to provide the droplets of water 41 and then move away from the water receiving surface 42 (e.g. by moving upwards or by moving to one side). The imprint template holder 8 and imprint template 9 are moved (in the direction shown by the solid arrow) until they are above the water droplets 41. The water droplets 41 evaporate, thereby increasing the humidity in the local environment of the imprint template 9. Water condenses on the imprint template 9, thereby forming a film of water on the surface of the imprint template. The film of water may include gaps or discontinuities, and may effectively be a plurality of films of water. The imprint template holder 8 and imprint template 9 are then moved (in the direction shown by the dashed arrow) to a position which is above imprintable medium 11 provided on the substrate 12.

The actuator 10 is then used to move the imprint template 9 into contact with the imprintable medium 11. The imprintable medium 11 is cured using actinic radiation, and the imprint template 9 is then separated from the imprintable medium 11. The presence of water on the imprint template 9 allows the imprint template 9 to be separated from the cured imprintable medium 11 more easily than would have been the case if the water vapor were not present.

The speed at which the droplets of water 41 evaporate may be controlled to some extent by selecting a diameter for the droplets of water when they are provided by the print head 40.

In an arrangement (not illustrated), instead of or in addition to moving the imprint template 9 to the surface 42, the surface 42 is moved to the imprint template 9 (the surface may be, for example, a moveable plate).

In a further embodiment of the invention (not illustrated), water is mixed with the imprintable medium. The vapor pressure of water is around 32 mbar at 25° C. This may be a factor of 30 or more less than the vapor pressure of other components of the imprintable medium. Consequently, once the water and imprintable medium has been provided on a substrate, the water evaporates before other components of the imprintable medium evaporate. This increases the humidity in the local environment of the imprint template. Some of the water condenses on the imprint template, thereby forming a film of water on the imprint template. The film of water may include gaps or discontinuities, and may effectively be a plurality of films of water. Once evaporation of water from the water and imprintable medium mixture is substantially complete, the imprint template is contacted with the imprintable medium. Actinic radiation is used to cure the imprintable medium, and the imprint template is then separated from the imprintable medium.

The water may be mixed with the imprintable medium using a mixer which is located in the lithographic apparatus. Alternatively or additionally, the water may be mixed with the imprintable medium outside of the lithographic apparatus.

The imprint template 9 may be, for example, formed from quartz. The inorganic release layer may be, for example, a metal oxide or metal nitride layer. The inorganic release layer may be, for example, a ceramic. The inorganic release layer may be, for example, one of the following: $TiN_x$, $TiO_x$, $TaN_x$, $TaO_x$, $AlO_x$, $AlN_x$, $CuO_x$, $SbO_x$, $WO_x$, $WN_x$, $GeN_x$, $GeO_x$, $SiN_x$, $CoN_x$ or $CoO_x$. The inorganic release layer may be stoichiometric or non-stoichiometric. Other inorganic release layers may be used.

Water preferentially adheres to the inorganic release layer of the imprint template, compared to for example a metal surface of the lithographic apparatus. It is believed that this is because the inorganic release layer has an affinity for water.

Embodiments of the invention provide an imprint lithography apparatus in which a local environment in the vicinity of an imprint template has a higher humidity than other parts of the lithographic apparatus. This allows water to form on the surface of the imprint template (and thereby reduce interfacial forces), while avoiding having a high humidity in other parts of the lithographic apparatus. It may be desirable to avoid having high humidity at other parts of the lithographic apparatus, since this may have a detrimental effect on operation of the lithographic apparatus, and may lead to corrosion of the lithographic apparatus.

The term "local environment in the vicinity of an imprint template" may be interpreted as meaning a volume which connects with a patterned surface of the imprint template, and which is sufficiently close to the imprint template that at least some water vapor present in the volume will condense on the patterned surface of the imprint template.

Some water may be present on the surface of an imprint template in a prior art lithographic apparatus (usually there will be some humidity in the lithographic apparatus). However, the amount of water present on the surface of the imprint template in a prior art lithographic apparatus will be significantly less than the amount of water present on the surface of the imprint template of embodiments of the invention.

The term 'film of water' is not intended to mean that a continuous layer of water exists across the patterned region of the imprint template. The film may include gaps or discontinuities, and may effectively be a plurality of films.

The amount of water present on the patterned surface of the imprint template may be sufficiently small that the water does not coalesce into droplets.

Water is an example of a polar molecule. Although the above described embodiments of the invention refer to the use of water, embodiments of the invention may use polar molecules other than water. Where this is the case, the water tanks 12, 22 referred to above may instead be tanks configured to contain the polar molecules in liquid form. Similarly, the print heads 30, 40 referred to above may be configured to dispense the polar molecules in liquid form. The polar molecules may be, for example, methanol.

Although embodiments of the invention have referred to the use of actinic radiation to cure the imprintable medium, the imprintable medium may be cured using any suitable curing mechanism. The imprintable medium may be solidified using a mechanism other than curing.

Features of one or more of the above described embodiments of the invention may be combined together.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as planarization layers or anti-reflection coating layers.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use one template holder arrangement per substrate holder. In an embodiment, there is provided an apparatus configured to use more than one template holder arrangement per substrate holder. In an embodiment, there is provided an apparatus that includes a plurality (e.g. 2, 3, or 4) of imprintable medium dispensers. In an embodiment, there is provided an apparatus that includes a plurality (e.g. 2, 3, or 4) of water dispensers (e.g. print heads). In an embodiment, there is provided an apparatus configured to use one imprintable medium dispenser per substrate holder and/or one water dispensing print head per substrate holder. In an embodiment, there is provided an apparatus configured to use one imprintable medium dispenser per imprint template arrangement and/or one water dispensing print head per substrate holder. In an embodiment, where an apparatus is provided that includes a plurality of substrate holders, the substrate holders may share functionalities in the apparatus. For instance, the substrate holders may share a substrate handler, a substrate cassette, a gas supply system (e.g. including apparatus arranged to mix water vapor with the gas), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the invention as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim.

Embodiments of the invention are provided in below numbered clauses:

1. A lithographic apparatus comprising:
    an imprint template holder configured to hold an imprint template; and
    a dispensing mechanism of polar molecules, wherein the dispensing mechanism of polar molecules is configured to provide polar molecules into a local environment in the vicinity of the imprint template, such that the concentration of polar molecules in the local environment in the vicinity of the imprint template is greater than the concentration of polar molecules in other parts of the lithographic apparatus.
2. The lithographic apparatus of clause 1, wherein the dispensing mechanism of polar molecules further comprises a channel configured to deliver a mixture of the polar molecules and a gas to the local environment in the vicinity of the imprint template.
3. The lithographic apparatus of clause 2, wherein the dispensing mechanism of polar molecules further comprises a chamber configured to hold the polar molecules in liquid form, and further configured to facilitate passage of the gas through the polar molecules in liquid form such that the gas carries polar molecules.
4. The lithographic apparatus of clause 3, wherein the dispensing mechanism of polar molecules further comprises a pipe configured to deliver gas to the local environment in the vicinity of the imprint template without passing the gas through the polar molecules in liquid form.
5. The lithographic apparatus of clause 4, wherein the dispensing mechanism of polar molecules further comprises a valve configured to control the proportion of gas which carries polar molecules and the proportion of gas which has not passed through the polar molecules in liquid form.
6. The lithographic apparatus of any preceding clause, wherein the dispensing mechanism of polar molecules comprises a print head configured to print droplets of polar molecules in liquid form onto a substrate, and the lithographic apparatus is configured to bring the droplets of polar molecules in liquid form and the imprint template into the vicinity of each other.
7. The lithographic apparatus of clause 6, wherein the substrate is moveable, and the lithographic apparatus is configured to move the substrate to bring the droplets of polar molecules in liquid form into the vicinity of the imprint template.

8. The lithographic apparatus of any preceding clauses, wherein the dispensing mechanism of polar molecules comprises a print head configured to print droplets of polar molecules in liquid form onto a surface of the lithographic apparatus, and the lithographic apparatus is configured to bring the imprint template and the surface of the lithographic apparatus into the vicinity of each other.

9. The lithographic apparatus of any preceding clause, wherein the dispensing mechanism of polar molecules comprises a mixer configured to mix polar molecules in liquid form with imprintable medium.

10. The lithographic apparatus of any preceding clause, wherein the polar molecules are water and the dispensing mechanism of polar molecules comprises a source of water vapor.

11. The lithographic apparatus of clause 10, wherein the source of water vapor is configured to provide a humidity in the local environment in the vicinity of the imprint template of 65% RH or greater.

12. A method of imprint lithography using a lithographic apparatus, comprising:
providing polar molecules into a local environment in the vicinity of an imprint template having an inorganic release layer, such that the concentration of polar molecules in the local environment in the vicinity of the imprint template is greater than the concentration of polar molecules in other parts of the lithographic apparatus, thereby causing polar molecules to adhere to the release layer;
bringing the imprint template into contact with imprintable medium on a substrate;
solidifying the imprintable medium; and
then separating the imprint template from the solidified imprintable medium.

13. The method of clause 12, wherein the polar molecules are provided into the local environment in the vicinity of the imprint template by mixing the polar molecules with the imprintable medium before providing the imprintable medium on the substrate.

14. The method of clause 12 or clause 13, wherein the polar molecules are provided into the local environment in the vicinity of the imprint template by mixing the polar molecules with a gas and then delivering the gas and polar molecules mixture to the local environment in the vicinity of the imprint template.

15. The method of any of clauses 12-14, wherein the polar molecules are provided into the local environment in the vicinity of the imprint template by providing the polar molecules in liquid form on the substrate, and then bringing the polar molecules in liquid form into the local environment in the vicinity of the imprint template.

16. The method of clause 15, wherein the polar molecules in liquid form are brought into the local environment in the vicinity of the imprint template by moving the substrate to the vicinity of the imprint template.

17. The method of any of clauses 12-16, wherein the polar molecules are provided into the local environment in the vicinity of the imprint template by providing the polar molecules in liquid form on a surface of the imprint lithography apparatus, and then moving the imprint template to the vicinity of the surface of the imprint lithography apparatus.

18. The method of any of clauses 12-17, wherein the polar molecules are water.

19. The method of clause 18, comprising providing a humidity in the local environment in the vicinity of the imprint template of 65% RH or greater.

20. The method of clause 18 or clause 19, wherein the water forms a film on a patterned surface of the imprint template.

The invention claimed is:

1. A lithographic apparatus comprising:
a source structure holding therein polar molecules;
an imprint template holder configured to hold an imprint template; and
a dispensing mechanism, wherein the dispensing mechanism is configured to provide polar molecules into a local environment in the vicinity of the imprint template and configured to dispense polar molecules in liquid form onto a surface in the lithographic apparatus, the dispensing mechanism comprising a liquid connection to the source structure of the polar molecules and a further liquid connection for a source of another liquid; and
a control system configured to control provision of the polar molecules in liquid form onto the surface in the lithographic apparatus such that the concentration of polar molecules in the local environment in the vicinity of the imprint template is greater than the concentration of polar molecules in other parts of the lithographic apparatus configured to bring the polar molecules in liquid form and the imprint template into the vicinity of each other.

2. The lithographic apparatus of claim 1, wherein the dispensing mechanism of polar molecules further comprises a channel configured to deliver a mixture of the polar molecules and a gas to the local environment in the vicinity of the imprint template.

3. The lithographic apparatus of claim 1, wherein the dispensing mechanism comprises a print head configured to print droplets of the polar molecules in liquid form and wherein the surface comprises a surface of a substrate to be imprinted by the imprint template.

4. The lithographic apparatus of claim 1, wherein the dispensing mechanism comprises a print head configured to print droplets of the polar molecules in liquid form and wherein the surface comprises a surface of the lithographic apparatus other than a surface of a substrate to be imprinted by the imprint template.

5. The lithographic apparatus of claim 1, wherein the dispensing mechanism comprises a mixer configured to mix the polar molecules in liquid form with imprintable medium.

6. A method of imprint lithography using a lithographic apparatus, the method comprising:
providing polar molecules in liquid form on a surface in a local environment in the vicinity of an imprint template using a dispensing mechanism, such that the concentration of polar molecules in the local environment in the vicinity of the imprint template is greater than the concentration of polar molecules in other parts of the lithographic apparatus, thereby causing polar molecules to adhere to the imprint template, wherein the dispensing mechanism comprises a liquid connection for a source of the polar molecules and a further liquid connection for a source of another liquid;
bringing the polar molecules in liquid form in the vicinity of the imprint template;
bringing the imprint template into contact with imprintable medium on a substrate;
solidifying the imprintable medium; and then separating the imprint template from the solidified imprintable medium.

7. The method of claim 6, wherein the polar molecules are provided in the local environment in the vicinity of the imprint template by mixing the polar molecules with the imprintable medium before providing the imprintable medium on the substrate.

8. The method of claim 6, wherein the polar molecules are further provided in the local environment in the vicinity of the imprint template by mixing the polar molecules with a gas and then delivering the gas and polar molecules mixture to the local environment in the vicinity of the imprint template.

9. The method of claim 6, wherein the surface comprises a surface of the substrate and bringing the polar molecules in liquid form in the vicinity of the imprint template comprises moving the substrate and/or the imprint template to bring the polar molecules in liquid form adjacent a patterned surface of the imprint template.

10. The method of claim 6, wherein the surface comprises a surface of the imprint lithography apparatus other than the substrate, and bringing the polar molecules in liquid form in the vicinity of the imprint template comprises moving the imprint template to the vicinity of the surface of the imprint lithography apparatus.

11. The method of claim 6, wherein the polar molecules are water.

12. The method of claim 11, comprising providing a humidity in the local environment in the vicinity of the imprint template of 65% RH or greater.

13. The method of claim 11, wherein the water forms a film on a patterned surface of the imprint template.

14. The method of claim 6, wherein the polar molecules are provided in the local environment in the vicinity of the imprint template by moving the substrate to the vicinity of the imprint template.

15. The lithographic apparatus of claim 3, wherein the substrate is moveable, and the lithographic apparatus is configured to move the substrate to bring droplets of the polar molecules in liquid form into the vicinity of the imprint template.

16. A lithographic apparatus comprising:
a source structure holding therein polar molecules;
an imprint template holder configured to hold an imprint template; and
a dispensing mechanism, wherein the dispensing mechanism is configured to dispense polar molecules in liquid form onto a surface in the lithographic apparatus, the dispensing mechanism comprises a liquid connection to the source structure of the polar molecules and a further liquid connection for a source of another liquid, and the lithographic apparatus is configured to bring the polar molecules in liquid form and the imprint template into the vicinity of each other.

17. The lithographic apparatus of claim 16, wherein the dispensing mechanism further comprises a channel configured to deliver a mixture of the polar molecules and a gas to a local environment in the vicinity of the imprint template.

18. The lithographic apparatus of claim 16, wherein the dispensing mechanism comprises a mixer configured to mix the polar molecules in liquid form with imprintable medium.

19. The lithographic apparatus of claim 16, wherein the dispensing mechanism is configured to dispense the polar molecules in liquid form as droplets onto the surface and the surface comprises a surface of an imprintable medium of a substrate.

20. The lithographic apparatus of claim 16, wherein the lithographic apparatus is configured to bring the polar molecules in liquid form and the imprint template into the vicinity of each other by moving the imprint template and/or the surface relative to each other.

21. The lithographic apparatus of claim 16, wherein the other liquid comprises imprintable medium and the dispensing mechanism comprises a first dispenser having the liquid connection to the source structure of polar molecules and a second dispenser having the further liquid connection for the source of the other liquid comprising imprintable medium.

22. The lithographic apparatus of claim 1, wherein the other liquid comprises imprintable medium and the dispensing mechanism comprises a first dispenser having the liquid connection to the source structure of polar molecules and a second dispenser having the liquid connection for the source of the other liquid comprising imprintable medium.

* * * * *